United States Patent
Chen et al.

(10) Patent No.: US 7,495,911 B2
(45) Date of Patent: Feb. 24, 2009

(54) ACTIVE HEAT-DISSIPATING TYPE OF POWER SUPPLY APPARATUS HAVING HEAT-DISSIPATING MECHANISM FOR POWER INPUT DEVICE

(75) Inventors: Chih-Jen Chen, Taoyuan Hsien (TW); Nai-Chien Chang, Taoyuan Hsien (TW); Chen-Chiang Su, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 0 days.

(21) Appl. No.: 11/751,288

(22) Filed: May 21, 2007

(65) Prior Publication Data

US 2008/0037219 A1 Feb. 14, 2008

(30) Foreign Application Priority Data

Aug. 11, 2006 (TW) ............................... 95129708 A

(51) Int. Cl.
*H05K 7/20* (2006.01)
(52) U.S. Cl. ....................... 361/695; 361/690; 361/697; 174/16.1; 174/16.3; 454/184
(58) Field of Classification Search ................. 361/690, 361/692, 694–695; 165/80.3, 104.33; 174/16.1; 312/223.2; 454/184
See application file for complete search history.

(56) References Cited

U.S. PATENT DOCUMENTS

| | | | | |
|---|---|---|---|---|
| 6,700,778 | B1 * | 3/2004 | Wang | 361/690 |
| 7,097,556 | B2 * | 8/2006 | Su | 454/184 |
| 7,215,542 | B2 * | 5/2007 | Chen et al. | 361/694 |
| 2005/0168942 | A1 * | 8/2005 | Steinbrecher | 361/690 |
| 2006/0104026 | A1 * | 5/2006 | Chen et al. | 361/694 |

FOREIGN PATENT DOCUMENTS

DE 20301195 U1 * 3/2003

* cited by examiner

*Primary Examiner*—Boris L Chervinsky
(74) *Attorney, Agent, or Firm*—Kirton & McConkie; Evan R. Witt

(57) ABSTRACT

An active heat-dissipating type of power supply apparatus includes a casing, a first airflow channel, a second airflow channel, plural electronic components, an airflow driving device and a power input device. The casing includes at least one first airflow opening. The first airflow opening is communicated with the second airflow channel. The electronic components are disposed in the first airflow channel. The airflow driving device includes an airflow gate. The power input device is disposed on the first side of the casing and in the second airflow channel. A cooling air is pumped by the airflow driving device to be introduced into the second airflow channel through one of the first airflow opening and the airflow gate, so that the heat generated from the power input device is exhausted through the other one of the first airflow opening and the airflow gate.

14 Claims, 6 Drawing Sheets

ACTIVE HEAT-DISSIPATING TYPE OF POWER SUPPLY APPARATUS HAVING HEAT-DISSIPATING MECHANISM FOR POWER INPUT DEVICE

FIELD OF THE INVENTION

The present invention relates to an active heat-dissipating type of power supply apparatus, and more particularly to an active heat-dissipating type of power supply apparatus having a heat-dissipating mechanism for removing heat from a power input device.

BACKGROUND OF THE INVENTION

Power supply apparatuses are essential for many electronic appliances and information products. Referring to FIG. 1, a schematic perspective view of an active heat-dissipating type of power supply apparatus is illustrated. The power supply apparatus 1 of FIG. 1 comprises a casing 11 (as indicated in the dotted line), plural electronic components 12, a power input device 13 and a power output device 14. The power input device 13 is an electronic connector such as a power socket. By plugging a plug of a power cable into the power socket 13, an AC voltage is transmitted from an external power source to the power supply apparatus 1. The AC voltage transmitted from the external power source is converted by the electronic components 12 into a regulated DC output voltage, which is transmitted to an electronic device through the power output device 14. During operation, the electronic components 12 may generate energy in the form of heat, and thus the space within the casing 11 is warmed up. If the power supply apparatus 1 fails to transfer enough heat to the ambient air, the elevated operating temperature may result in damage of the electronic components, a breakdown of the whole power supply apparatus 1 or reduced power conversion efficiency. For removing the heat, by forced convection, one or more fans 15 are used to either inhale the ambient air to cool the electronic components or exhaust the hot air to remove heat.

Please refer to FIG. 1 again. The ambient air is inhaled by the fan 15 into the space within the casing 11. The inhaled air is then conducted to the electronic components 12 to partially remove the heat generated from the electronic components 12. At the same time, a hot air is exhausted to the surroundings through an outlet (not shown). Since the hot air may conduct heat to the power input device 13, a portion of heat is accumulated on the power input device 13 due to a large thermal resistance thereof. As the power supply apparatus 1 is developed toward minimization and high power, the electronic components 12 may generate more heat. In addition, the current passing through the conductive terminals of the power input device 13 is also increased and thus the power input device 13 may generate more heat per se. For complying with safety regulations, it is important to dissipate heat away the power input device 13.

Moreover, according to an international standard safety temperature regulation, the operating temperature of the power input device 13 needs to be below such as 70° C. Nowadays, with development of diversified electronic devices, more and more electronic components 12 are loaded in the power supply apparatus 1. With increasing integration of integrated circuits, the power consumption of the power supply apparatus 1 is largely increased. As previously described, the heat generated from the electronic components 12 may influence the temperature of the power input device 13. Generally, for preventing damage from high temperature, the electronic components 12 are made of high-temperature resistant material, which may withstand a high temperature such as 110~150° C. If the electronic components 12 are operated at such a high temperature, the operating temperature of the power input device 13 may exceed the acceptable value such as 70° C.

For a purpose of increasing integration of the electronic components 12, it is necessary to provide a heat-dissipating mechanism for removing heat from the power input device 13.

SUMMARY OF THE INVENTION

It is an object of the present invention to provide an active heat-dissipating type of power supply apparatus having a heat-dissipating mechanism for removing heat from a power input device, so that the power input device complies with the standard safety temperature regulation.

In accordance with a first aspect of the present invention, there is provided an active heat-dissipating type of power supply apparatus, which includes a casing, a first airflow channel, a second airflow channel, plural electronic components, an airflow driving device and a power input device. The casing includes a first side with at least one first airflow opening. The first airflow channel and the second airflow channel are defined within the casing. The first airflow opening is communicated with the second airflow channel. The electronic components are mounted within the casing and disposed in the first airflow channel. The airflow driving device is disposed on the first side of the casing and includes an airflow gate. The power input device is disposed on the first side of the casing and in the second airflow channel. A cooling air is pumped by the airflow driving device to be introduced into the second airflow channel through one of the first airflow opening and the airflow gate, so that the heat generated from the power input device is removed by the cooling air and exhausted through the other one of the first airflow opening and the airflow gate.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
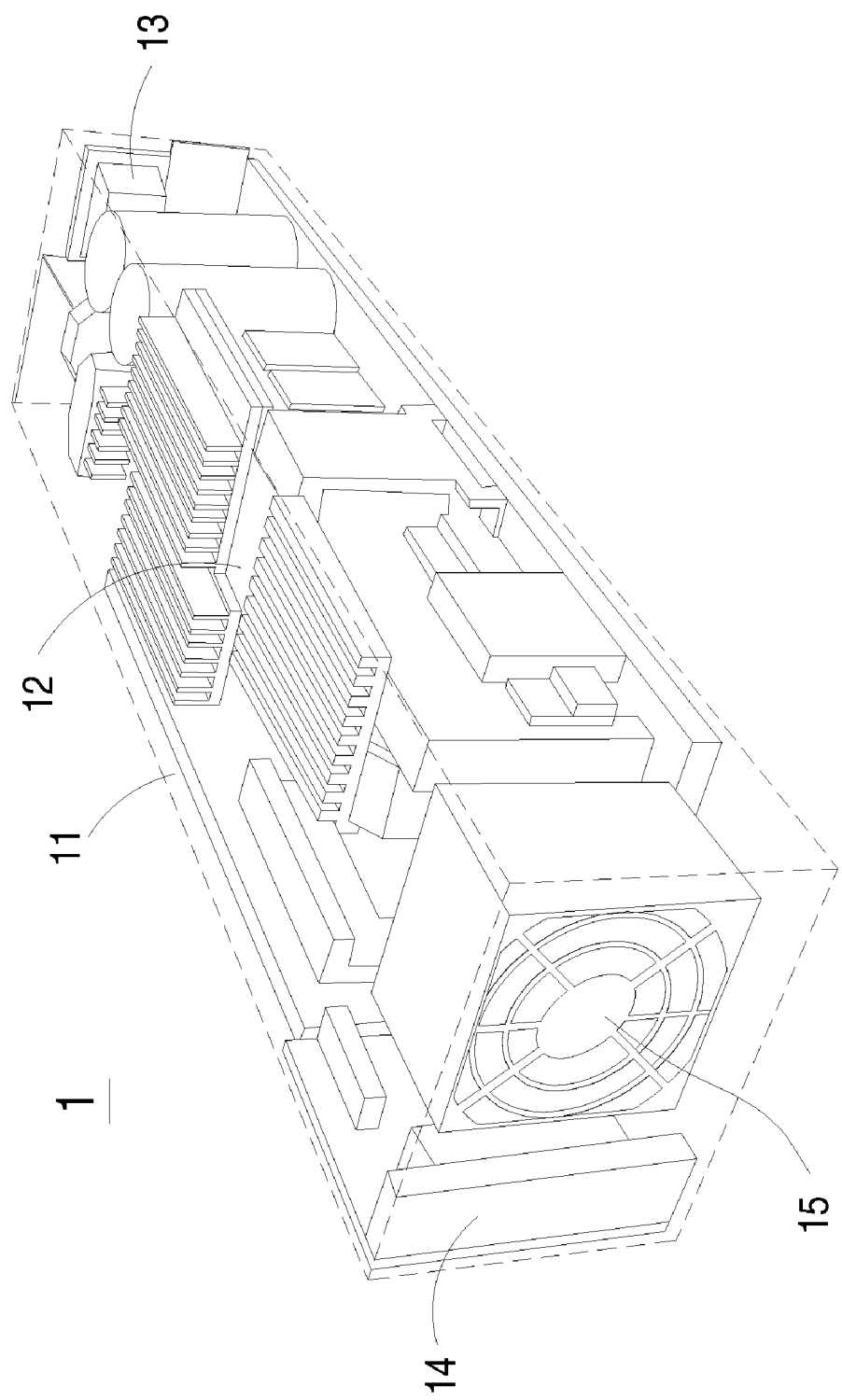
FIG. 1 is a schematic perspective view of an active heat-dissipating type of power supply apparatus.
Figure 2:
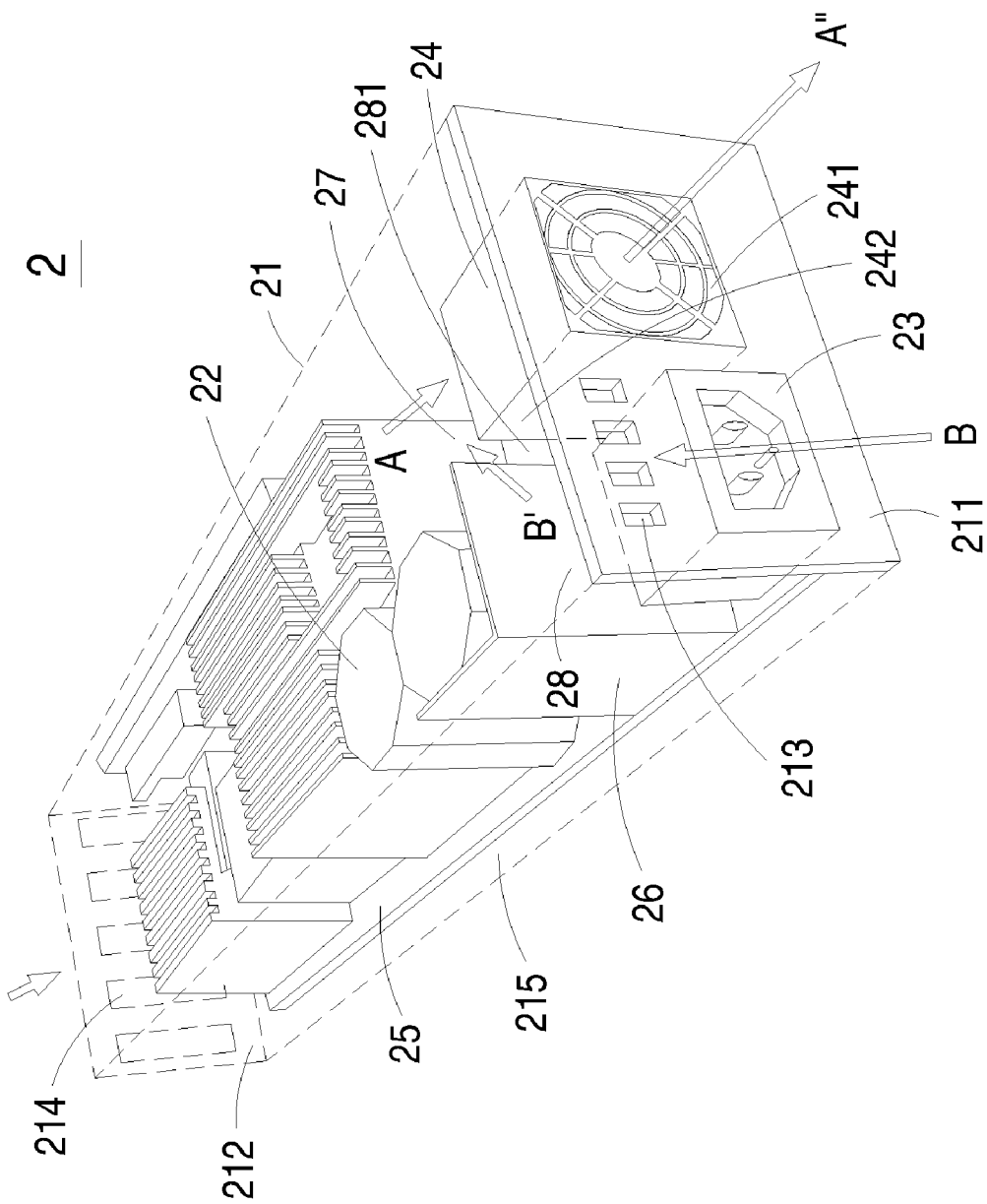
FIG. 2 is a schematic perspective view illustrating an active heat-dissipating type of power supply apparatus having a heat-dissipating mechanism for removing heat from a power input device according to a first preferred embodiment of the present invention.

Please refer to FIG. 2, which is a schematic perspective view illustrating an active heat-dissipating type of power supply apparatus having a heat-dissipating mechanism for removing heat from a power input device according to a preferred embodiment of the present invention. As shown in FIG. 2, the active heat-dissipating type of power supply apparatus 2 includes a casing 21 (as indicated in the dotted line), plural electronic components 22, a power input device 23, an airflow driving device 24 and a power output device (not shown). The electronic components 22 are mounted on a printed circuit board 25 inside the casing 21. The power input device 23 is disposed on a first side 211 of the casing 21 and electrically connected to the printed circuit board 25. The power output device is disposed on a second side 212 of the casing 21 and electrically connected to the printed circuit board 25. The first side 211 of the casing 21 includes at least one first airflow opening 213. The second side 212 of the casing 21 includes at least one second airflow opening 214. In this embodiment, the second side 212 is opposed to the first side 211. The electronic components 22 are arranged between the first side 211 and the second side 212 of the casing 21. An exemplary airflow driving device 24 is a fan, which is disposed on the first side 211 of the casing 21. In addition, a sidewall 242 of the airflow driving device 24 is close to the power input device 23. The first airflow opening 213 in the first side 211 of the casing 21 is also adjacent to the power input device 23.

Please refer to FIG. 2 again. The active heat-dissipating type of power supply apparatus 2 further includes a first airflow channel 27 formed within the casing 21. In particular, the first airflow channel 27 is defined between the airflow driving device 24, the second airflow opening 214 of the casing 21, the upper side of the casing 21 and the electronic components 22. The second airflow opening 214 and an airflow gate 241 of the airflow driving device 24 serve as inlet and outlet of the first airflow channel 27, respectively. The active heat-dissipating type of power supply apparatus 2 further includes a heat-insulating plate 26, which is arranged between the electronic components 22 and the power input device 23. Especially, the first side 211, the third side 215 and the upper side of the casing 21, the heat-insulating plate 26 and the sidewall 242 of the airflow driving device 24 cooperatively define a second airflow channel 28. A gap 281 is formed between the sidewall 242 of the airflow driving device 24 and the heat-insulating plate 26 to be used as another airflow gate. The first airflow opening 213 in the first side 211 of the casing 21 and the gap 281 serve as inlet and outlet of the second airflow channel 28.

The heat-dissipating mechanism of the active heat-dissipating type of power supply apparatus 2 will be illustrated as follows in more details.

When the airflow driving device 24 is actuated, a greater amount of cooling air is introduced into the first airflow channel 27 through the second airflow opening 214. The cooling air is conducted to the electronic components 22 to remove a portion of heat from the electronic components 22, and thus a heated air A is exhausted from the first airflow channel 27. At the same time, a less amount of cooling air B is introduced into the second airflow channel 28 through the first airflow opening 213. The cooling air may remove a portion of heat from the power input device 23, and thus a heated air B' is exhausted to the first airflow channel 27 through the gap 281. Afterwards, the heated air A and the heated air B' are mixed together and exhausted to the surroundings through the airflow gate 241 of the airflow driving device 24. In such manner, the heat generated from the power input device 23 is effectively dissipated away and the influence of the heat generated from the electronic components 22 on the power input device 23 is minimized.

In the embodiment of FIG. 2, the heat-insulating plate 26 may isolate the heat generated from the electronic components 22 and thus the influence of the heat generated from the electronic components 22 on the power input device 23 is minimized. On the other hand, since the heat-insulating plate 26, the casing 21 and the sidewall 242 of the airflow driving device 24 cooperatively define the second airflow channel 28, a portion of heat generated from the power input device 23 may be removed by the cooling air, which is introduced into the second airflow channel 28 through the first airflow opening 213. Therefore, the heat generated from the power input device 23 is effectively dissipated away. By means of the heat-dissipating mechanism of the present invention, the power input device 23 complies with the standard safety temperature regulation.

Figure 3:
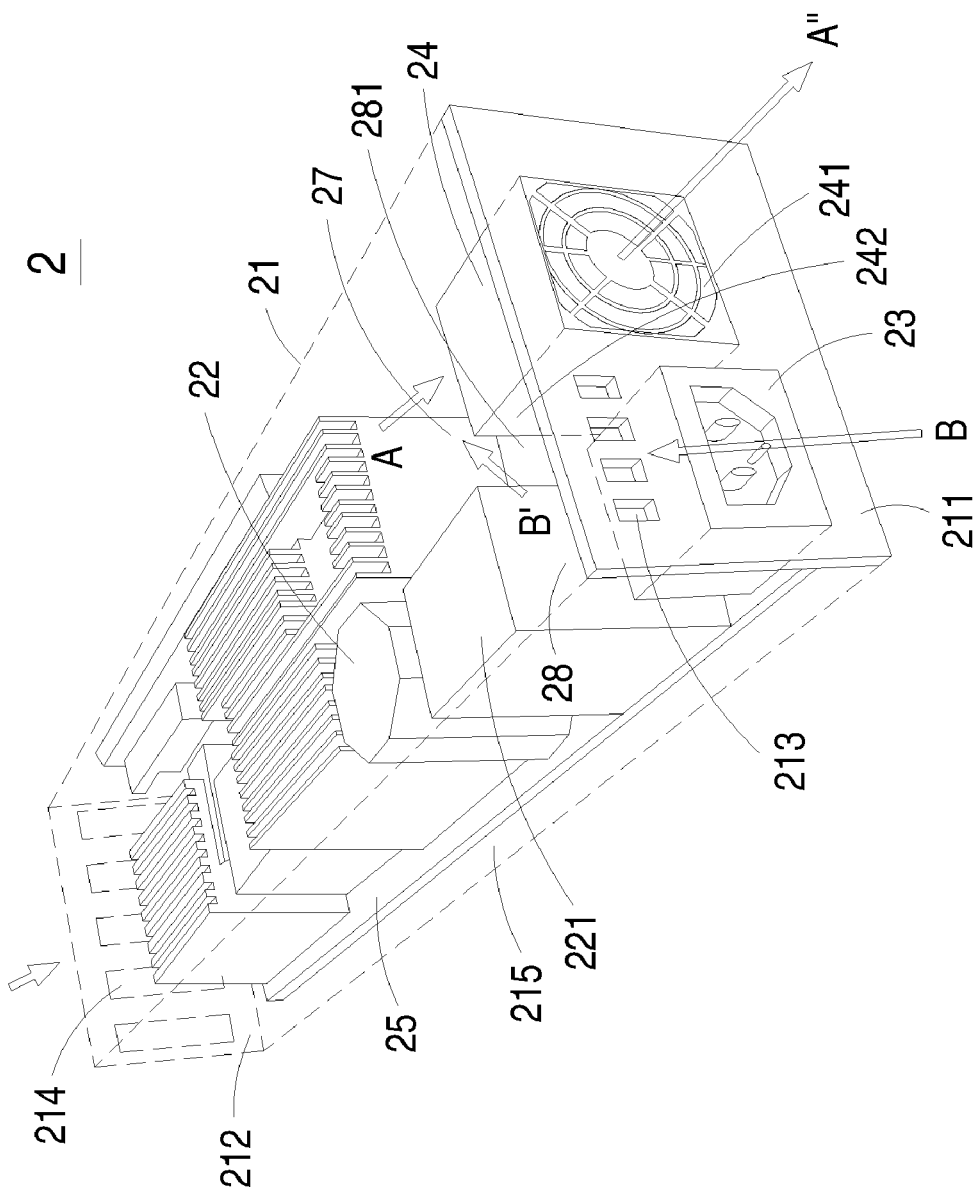
FIG. 3 is a schematic perspective view illustrating an active heat-dissipating type of power supply apparatus according to a second preferred embodiment of the present invention.

Another embodiment of an active heat-dissipating type of power supply apparatus having a heat-dissipating mechanism for removing heat from a power input device is illustrated in FIG. 3. In this embodiment, the heat-insulating plate 26 is replaced by a relative large-sized electronic component 221 such as a magnetic element or a transformer. The other components of the active heat-dissipating type of power supply apparatus of FIG. 3 are substantially identical to those shown in FIG. 2, and are not redundantly described herein.

Figure 4:
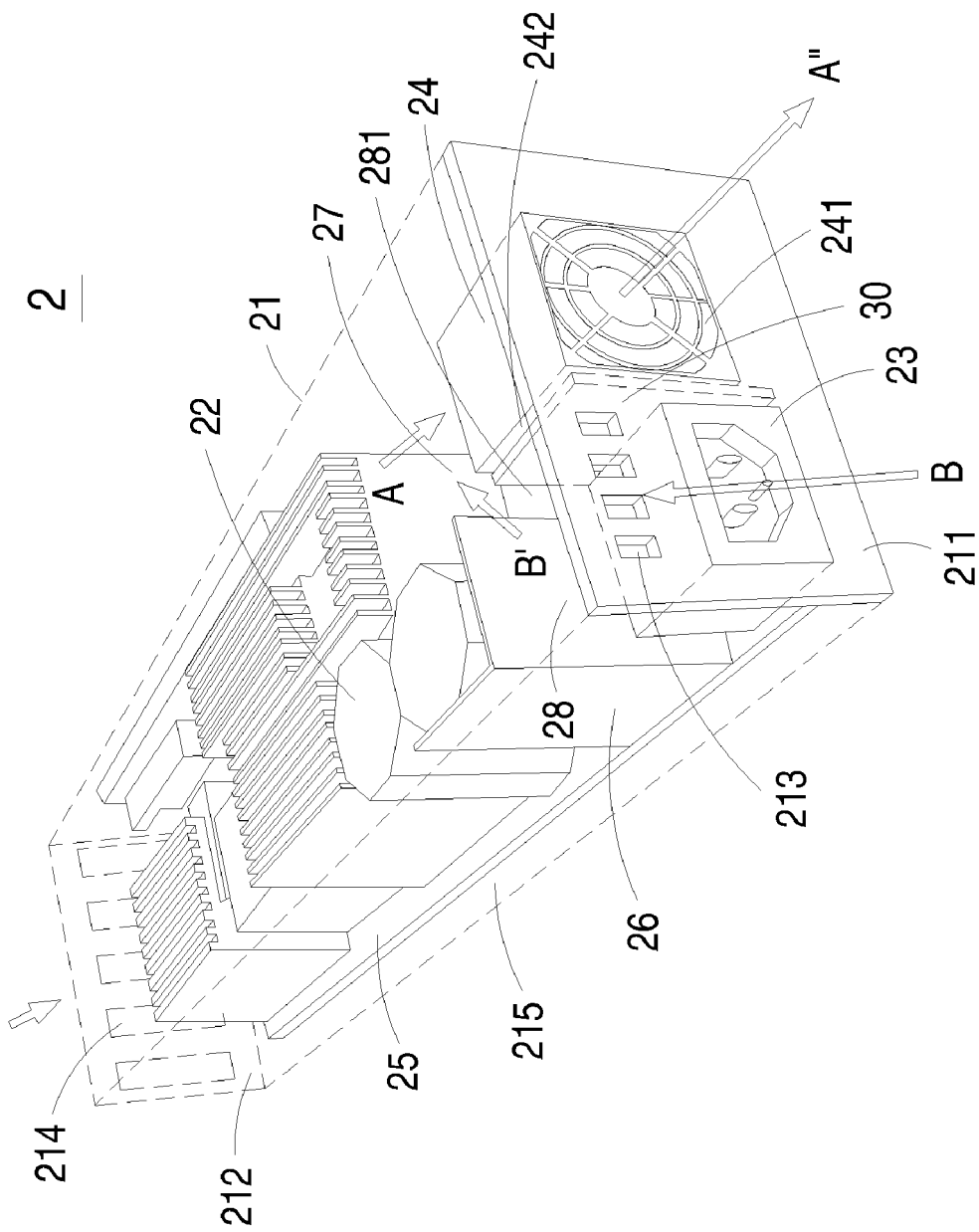
FIG. 4 is a schematic perspective view illustrating an active heat-dissipating type of power supply apparatus according to a third preferred embodiment of the present invention.

A further embodiment of an active heat-dissipating type of power supply apparatus having a heat-dissipating mechanism for removing heat from a power input device is illustrated in FIG. 4. In comparison with FIG. 2, the active heat-dissipating type of power supply apparatus of FIG. 4 further includes a partition plate 30 between the sidewall 242 of the airflow driving device 24 and the power input device 23. Under this circumstance, the second airflow channel 28 is cooperatively defined by the first side 211, the third side 215 and the upper side of the casing 21, the heat-insulating plate 26 (or the large-sized electronic component 221 as shown in FIG. 3) and the partition plate 30. The other components of the active heat-dissipating type of power supply apparatus of FIG. 4 are substantially identical to those shown in FIG. 2, and are not redundantly described herein.

Figure 5:
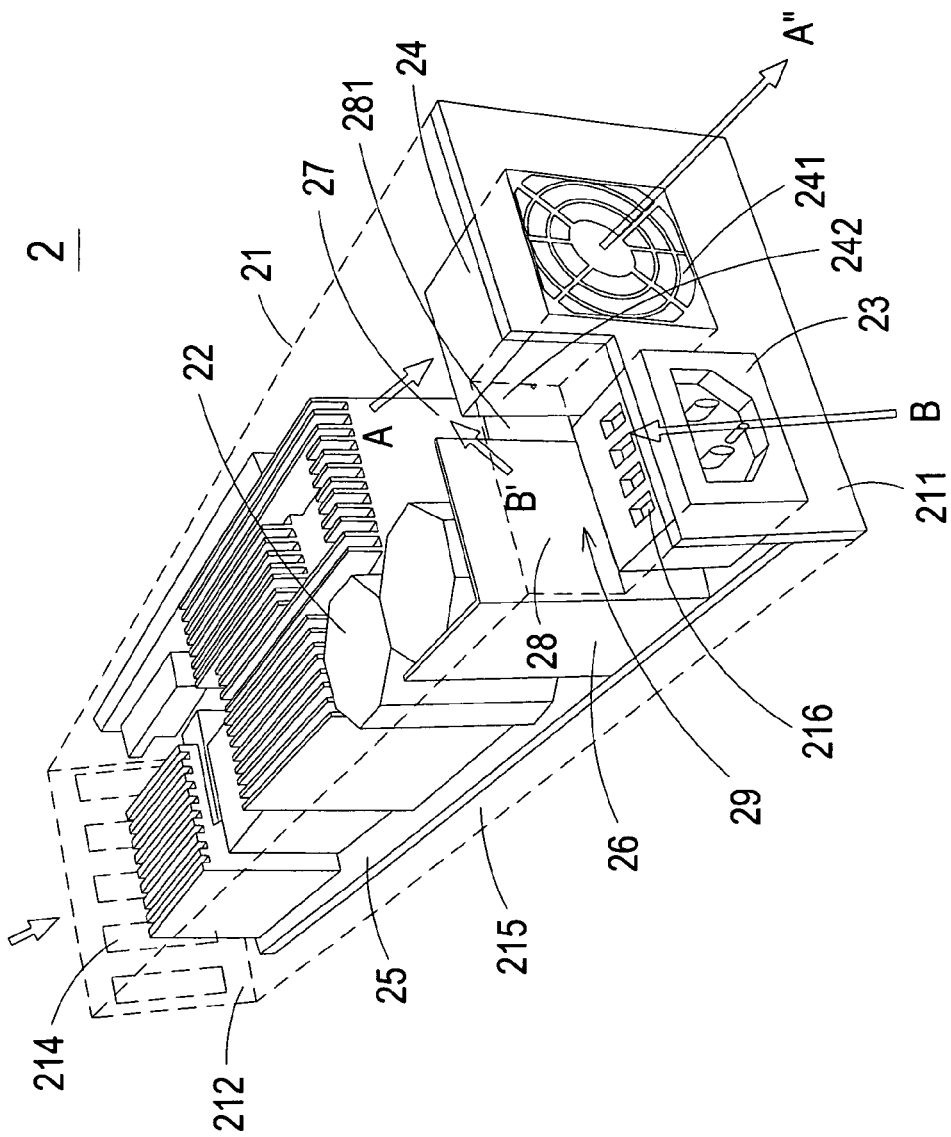
FIG. 5 is a schematic perspective view illustrating an active heat-dissipating type of power supply apparatus according to a fourth preferred embodiment of the present invention.

A further embodiment of an active heat-dissipating type of power supply apparatus having a heat-dissipating mechanism for removing heat from a power input device is illustrated in FIG. 5. In comparison with FIG. 2, the casing 21 of the active heat-dissipating type of power supply apparatus of FIG. 5 has a different shape. The casing 21 has a concave portion 29 in the vicinity of the power input device 23. At least one of one third airflow opening 216 is disposed at the bottom of the concave portion 29. The cooling air B is introduced into the second airflow channel 28 through the third airflow opening 216. The cooling air may remove a portion of heat from the power input device 23, and thus a heated air B' is exhausted to the first airflow channel 27 through the gap 281. Afterwards, the heated air A and the heated air B' are mixed together and exhausted to the surroundings through the airflow gate 241 of the airflow driving device 24. The other components of the active heat-dissipating type of power supply apparatus of FIG. 5 are substantially identical to those shown in FIG. 2, and are not redundantly described herein.

In the above embodiments, the first airflow opening 213 is disposed above the power input device 23. Alternatively, the first airflow opening 213 may be disposed under the power input device 23 or at the right or left of the power input device 23. In addition, the second airflow opening 214 may be disposed in any side of the casing 21 other than the first side 211.

Figure 6:
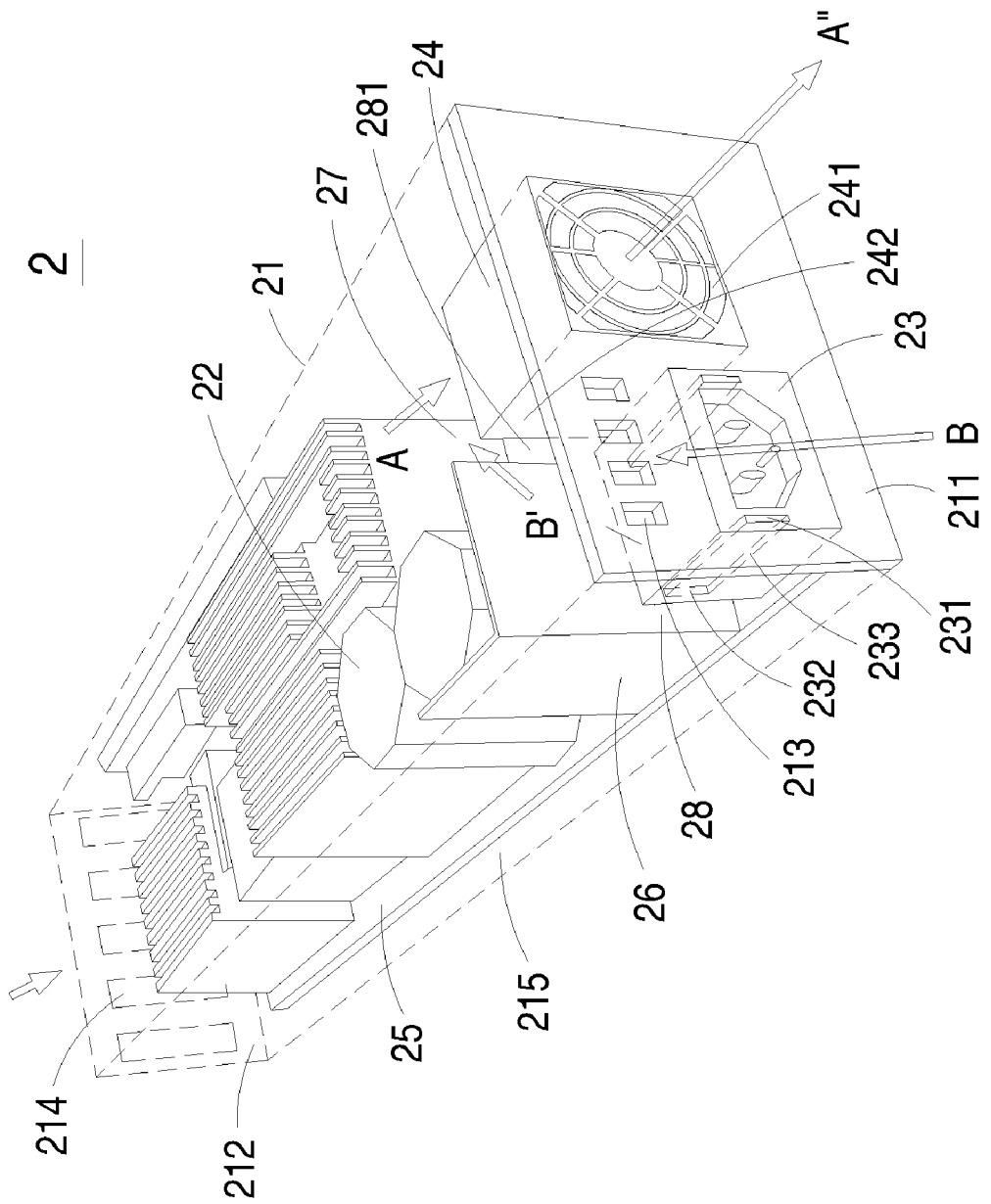
FIG. 6 is a schematic perspective view illustrating an active heat-dissipating type of power supply apparatus according to a fifth preferred embodiment of the present invention.

A further embodiment of an active heat-dissipating type of power supply apparatus having a heat-dissipating mechanism for removing heat from a power input device is illustrated in FIG. 6. In this embodiment, the power input device 23 includes a main body and an outer cover. The main body and the outer cover cooperatively define a first port 231, a second port 232 and an airflow passageway 233. The first port 231 and the second port 232 are communicated with the airflow passageway 233. Likewise, additional cooling air may be introduced into the second airflow channel 28 through the first port 231, the airflow passageway 233 and the second port 232, thereby facilitating removing heat generated from the power input device 23.

In the above embodiments, when the airflow driving device 24 is actuated, the cooling air A and the cooling air B are introduced into the first airflow channel 27 and the second airflow channel 28 through the second airflow opening 214 and the first airflow opening 213, and the heated air A" is exhausted through the airflow gate 241. Nevertheless, the directions of the cooling air and the heated air may be reversed. That is, when the airflow driving device 24 is actuated, the cooling air is introduced into the first airflow channel 27 and the second airflow channel 28 through the airflow gate 241 of the airflow driving device 24, and the heated air is exhausted through the second airflow opening 214 and the first airflow opening 213.

From the above description, the active heat-dissipating type of power supply apparatus is effective for removing the heat generated from the electronic components 22 through the first airflow channel 27 and removing the heat generated from the power input device 23 through the second airflow channel 28. Moreover, the influence of the heat generated from the electronic components 22 on the power input device 23 is minimized. By means of the heat-dissipating mechanism of the present invention, the power input device 23 complies with the standard safety temperature regulation.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An active heat-dissipating type of power supply apparatus comprising:
    a casing including a first side with at least one first airflow opening;
    a first airflow channel and a second airflow channel defined within said casing, said second airflow channel using said first airflow opening as one of an inlet and an outlet;
    plural electronic components mounted within said casing and disposed in said first airflow channel;
    an airflow driving device disposed on said first side of said casing and including an airflow gate;
    a power input device disposed on said first side of said casing and in said second airflow channel; and
    a heat-insulating plate disposed between said electronic components and said power input device, wherein a gap is formed between a sidewall of said airflow driving device and said heat-insulating plate, and said second airflow channel is communicated with said first airflow channel through said gap;
    wherein a cooling air is pumped by said airflow driving device to be introduced into said second airflow channel through one of said first airflow opening and said airflow gate, so that the heat generated from said power input device is removed by said cooling air and exhausted through the other one of said first airflow opening and said airflow gate.

2. The active heat-dissipating type of power supply apparatus according to claim 1 wherein said power input device is a power socket.

3. The active heat-dissipating type of power supply apparatus according to claim 1 wherein said airflow driving device is a fan.

4. The active heat-dissipating type of power supply apparatus according to claim 1 wherein said casing further includes a second side with at least one second airflow opening.

5. The active heat-dissipating type of power supply apparatus according to claim 4 wherein said second side of said casing is opposed to said first side.

6. The active heat-dissipating type of power supply apparatus according to claim 4 wherein a cooling air is pumped by said airflow driving device to be introduced into said first airflow channel through one of said second airflow opening and said airflow gate, so that the heat generated from said electronic components is removed by said cooling air and exhausted through the other one of said second airflow opening and said airflow gate.

7. The active heat-dissipating type of power supply apparatus according to claim 1 wherein said first airflow opening is disposed adjacent to said power input device.

8. The active heat-dissipating type of power supply apparatus according to claim 1 wherein said sidewall of said airflow driving device is close to said power input device.

9. The active heat-dissipating type of power supply apparatus according to claim 8 wherein said first side, a third side and an upper side of said casing, said heat-insulating plate and said sidewall of said airflow driving device cooperatively define said second airflow channel.

10. The active heat-dissipating type of power supply apparatus according to claim 1 further including a partition plate between said airflow driving device and said power input device, wherein said first side, a third side and an upper side of said casing, said heat-insulating plate and said partition plate cooperatively define said second airflow channel.

11. The active heat-dissipating type of power supply apparatus according to claim 1 further including a circuit board, wherein said electronic components are mounted on said circuit board and said power input device is electrically connected to said circuit board.

12. The active heat-dissipating type of power supply apparatus according to claim 1 wherein said second airflow channel is cooperatively defined by said first side, a third side and an upper side of said casing, one of said electronic components and a sidewall of said airflow driving device.

13. The active heat-dissipating type of power supply apparatus according to claim 1 wherein said casing has a concave portion in the vicinity of said power input device, and at least of one third airflow opening is disposed at the bottom of said concave portion.

14. The active heat-dissipating type of power supply apparatus according to claim 1 wherein said power input device further includes a first port, a second port and an airflow passageway, wherein said first port and said second port are communicated with said airflow passageway, and said second port is communicated with said second airflow channel.

* * * * *